(12) United States Patent
Lee et al.

(10) Patent No.: US 11,628,660 B2
(45) Date of Patent: Apr. 18, 2023

(54) MECHANICAL-METAMATERIAL-BASED STRETCHABLE SUBSTRATE WITH NEGATIVE POISSON'S RATIO AND MANUFACTURING METHOD THEREOF

(71) Applicant: Korea Institute of Science and Technology, Seoul (KR)

(72) Inventors: Phillip Lee, Seoul (KR); Seungjun Chung, Seoul (KR); Jeong Gon Son, Seoul (KR); Jai Kyeong Kim, Seoul (KR); Heesuk Kim, Seoul (KR); Suk Joon Hwang, Seoul (KR); Byung Soo Kang, Seoul (KR)

(73) Assignee: Korea Institute of Science and Technology, Seoul (KR)

( * ) Notice: Subject to any disclaimer, the term of this patent is extended or adjusted under 35 U.S.C. 154(b) by 0 days.

(21) Appl. No.: 17/177,943

(22) Filed: Feb. 17, 2021

(65) Prior Publication Data
US 2022/0161517 A1    May 26, 2022

(30) Foreign Application Priority Data
Nov. 25, 2020  (KR) .......................... 10-2020-0160360

(51) Int. Cl.
| B32B 37/12 | (2006.01) |
| B32B 7/022 | (2019.01) |
| B32B 38/08 | (2006.01) |
| B32B 38/00 | (2006.01) |
| H05K 1/02 | (2006.01) |
| H05K 1/03 | (2006.01) |

(52) U.S. Cl.
CPC .............. *B32B 37/12* (2013.01); *B32B 7/022* (2019.01); *B32B 38/08* (2013.01); *B32B 38/145* (2013.01); *H05K 1/0283* (2013.01); *H05K 1/03* (2013.01); *B32B 2038/0076* (2013.01); *B32B 2305/02* (2013.01); *B32B 2307/51* (2013.01); *B32B 2319/00* (2013.01); *B32B 2457/20* (2013.01)

(58) Field of Classification Search
CPC ....... B32B 37/025; B32B 37/12; B32B 38/08; B32B 38/145; B32B 2038/0076; B32B 2305/02; B32B 2319/00; B32B 2307/51; H05K 1/0283
See application file for complete search history.

(56) References Cited

U.S. PATENT DOCUMENTS

| 2014/0059734 A1* | 3/2014 | Toronjo | ................... A41B 1/08 2/69 |
| 2018/0325216 A1* | 11/2018 | Toronjo | ............. A43B 23/0265 |

FOREIGN PATENT DOCUMENTS

| CN | 211513372 U | * | 9/2020 |
| KR | 10-2015-0077899 A | | 7/2015 |
| KR | 10-2016-0042288 A | | 4/2016 |

(Continued)

OTHER PUBLICATIONS

"Simple cubic three-dimensional auxetic materials" Shen et al. Jul. 2014.*

*Primary Examiner* — John L Goff, II
(74) *Attorney, Agent, or Firm* — Studebaker & Brackett PC

(57) ABSTRACT

Disclosed is a method of manufacturing a stretchable substrate according to various embodiments of the present disclosure for realizing the above-described objectives. The method may include generating an auxetic including a plurality of unit structures and adhering one or more elastic sheets to one surface of the auxetic.

9 Claims, 11 Drawing Sheets

(56) References Cited

FOREIGN PATENT DOCUMENTS

KR  10-2016-0105171 A    9/2016
WO  WO-2015109359 A1 *  7/2015  ........... B29C 44/357

* cited by examiner

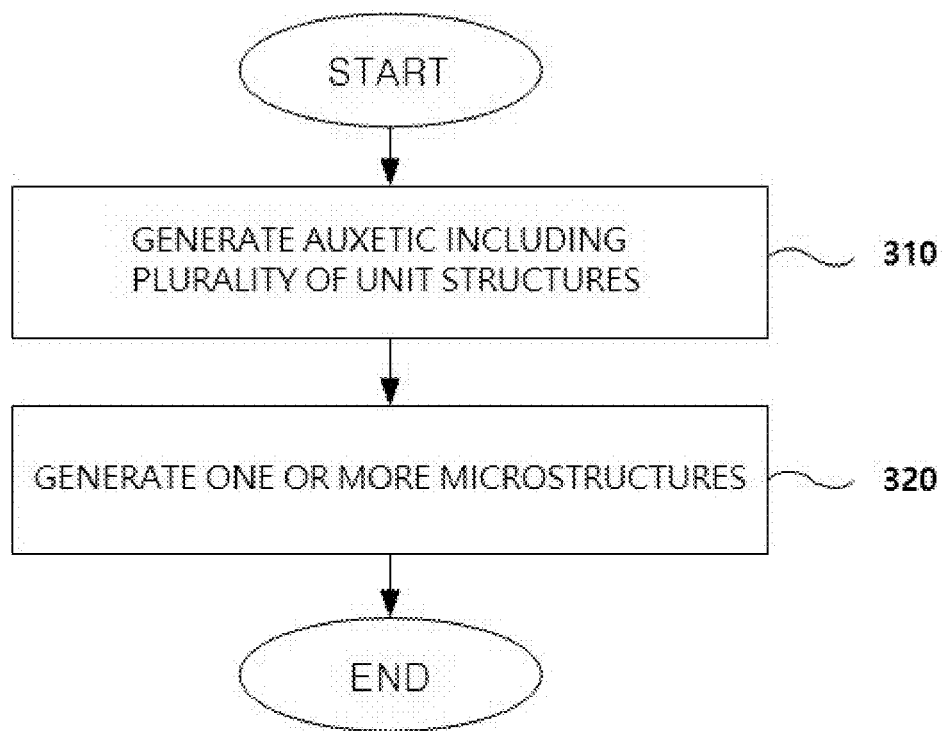

MECHANICAL-METAMATERIAL-BASED STRETCHABLE SUBSTRATE WITH NEGATIVE POISSON'S RATIO AND MANUFACTURING METHOD THEREOF

CROSS-REFERENCE TO RELATED APPLICATION

This application claims priority to and the benefit of Korean Patent Application No. 10-2020-0160360, filed on Nov. 25, 2020, the disclosure of which is incorporated herein by reference in its entirety.

BACKGROUND

1. Field of the Invention

The present disclosure relates to a stretchable substrate material, and more particularly, to a stretchable substrate capable of controlling, upon stretching along one axis, a strain related to another axis by generating an elastic substrate containing a mechanical metamaterial having a negative Poisson ratio, and a manufacturing method thereof.

2. Discussion of Related Art

Recently, research and development have been actively conducted on stretchable electronic devices in which electrodes are formed on a flexible substrate in a direction away from conductive devices in which electrodes are formed on a rigid substrate. A stretchable electronic device, which is an electronic device manufactured on a substrate that can be freely stretched by external stress, is a next-generation electronic device that maintains the electrical/physical properties of the device even when a mechanical deformation or an external force is applied thereto. Such a stretchable electronic device may be applied to flexible devices, wearable devices, or the like, and furthermore, may be used as a sensor, electrode, or the like attached to a display or the human body.

Flexible electronic devices can be most widely used in fields including stretchable displays, stretchable solar cells, stretchable energy storage/power generation devices, and the like, and show the possibility of a next-generation technology succeeding flexible displays. In addition, flexible electronic devices do not only increase the degree of freedom of design due to excellent mechanical variability but also secure mechanical stability against an external force. Thus, the market is expanding to wearable devices, electronic skin, smartphones, medical devices, healthcare monitoring systems, the military defense industry, the aerospace industry, and the like.

As a specific example, the display field is evolving from a fixed flat/curved display to flexible, foldable, and rollable types, which are folded or rolled in one direction, such that the degree of freedom of deformation increases. Recently, as electronic devices have become smart and space mobility is emphasized, there is a need to develop a stretchable display that can be used freely and deformed in multidimensional axis directions under various conditions beyond a fixed display.

As described above, with the development of technology related to the stretchable display field, it is expected that a new digital interface can be implemented beyond conventional methods. However, since stretchable displays do not have a fixed axis or direction of deformation unlike conventional flexible, foldable, and rollable displays, distortion during deformation is emerging as an issue.

Accordingly, it may be necessary to develop a substrate that can be freely deformed without display distortion even under low stress and a technology for stretchable electrodes with low resistance, high flexibility, and high stability. That is, in related industries, there may be a demand for a stretchable substrate with a stable mechanical strain, reduced distortion, and high transmittance.

SUMMARY OF THE INVENTION

An object to be achieved by the present disclosure is to solve the above-described problems, and the present disclosure is directed to providing a stretchable substrate capable of controlling, when the corresponding substrate is stretched along one axis, a strain related to another axis by generating an elastic substrate containing a mechanical metamaterial with a negative Poisson's ratio, and a manufacturing method thereof.

Objects to be achieved by the present disclosure are not limited to the aforementioned object, and other objects not mentioned herein can be clearly understood by those skilled in the art from the following description.

According to an aspect of the present disclosure, there is disclosed a method of manufacturing a stretchable substrate. The method may include generating an auxetic including a plurality of unit structures and adhering one or more elastic sheets to one surface of the auxetic.

The generating of the auxetic may include generating the auxetic on a fixing surface, forming a fixing part, performing curing, and separating the fixing surface.

The adhering of the one or more elastic sheets to the one surface of the auxetic comprises applying an adhesive or an elastic liquid onto the auxetic and attaching an elastic sheet to the auxetic.

The one or more elastic sheets may be attached to both surfaces of the auxetic.

The attaching of the one or more elastic sheets to the one surface of the auxetic may further include performing curing.

The generating of the auxetic may include forming the auxetic on the fixing surface, filling an internal elastomer, and separating the fixing surface, and the internal elastomer may be filled into at least some of the plurality of unit structures.

The generating of the auxetic may include generating a substrate part made of an elastic material, forming the auxetic including the plurality of unit structures on the substrate part; and filling the internal elastomer into each of the plurality of unit structures.

The internal elastomer may be an elastic material with a negative Poisson's ratio.

The generating of the auxetic including the plurality of unit structures may include generating an auxetic including a porous pattern, and the porous pattern may be formed to include one or more holes including an inner space layer.

The generating of the auxetic including the porous pattern may include generating a substrate part and forming the auxetic including the porous pattern on the substrate part, and the porous pattern may have one or more holes.

According to another aspect of the present disclosure, there is disclosed a stretchable substrate. The stretchable substrate may include an auxetic including a plurality of unit structures and having a negative Poisson's ratio, a fixing part configured to fix the auxetic, and one or more elastic sheets adhered to one surface of the auxetic.

The stretchable substrate may further include a substrate part of an elastic material wherein the auxetic may be coupled to one surface of the substrate part.

The stretchable substrate may further include a fixing surface configured to temporarily support the auxetic while forming the auxetic.

The stretchable substrate may further include an adhesive layer or an elastic liquid layer provided between the auxetic and the one or more elastic sheets.

The stretchable substrate may further include an inner elastomer filled into at least some of the plurality of unit structures, wherein the inner elastomer may be an elastic material with a negative Poisson's ratio.

The plurality of unit structures may include a porous pattern, and the porous pattern may include one or more holes including an inner space layer.

Other specific details of the present disclosure are included in the detailed description and drawings.

BRIEF DESCRIPTION OF THE DRAWINGS

The above and other objects, features and advantages of the present invention will become more apparent to those of ordinary skill in the art by describing exemplary embodiments thereof in detail with reference to the accompanying drawings, in which:

FIG. 7 is a flowchart illustrating a method of manufacturing a stretchable substrate including one or more microstructures according to an embodiment of the present disclosure;

DETAILED DESCRIPTION OF EXEMPLARY EMBODIMENTS

Figure 1:
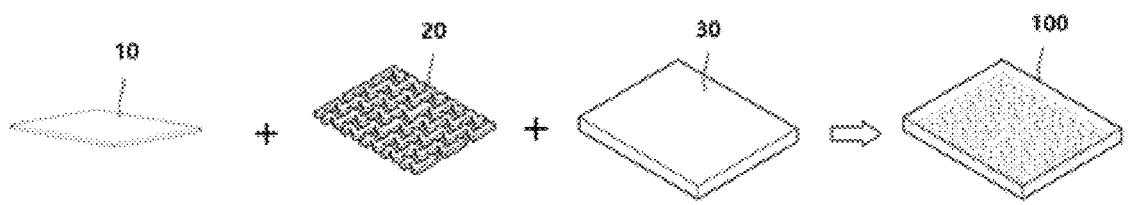
FIG. 1 is a schematic diagram showing a stretchable substrate according to an embodiment of the present disclosure.

Various embodiments and/or aspects will now described with reference to the drawings. In the following description, for purposes of description, numerous specific details are set forth in order to provide a thorough understanding of one or more aspects. However, it is to be understood by those skilled in the art that such aspect(s) may be practiced without these specific details. The following description and the accompanying drawings set forth in detail certain illustrative features of the one or more aspects. These aspects are indicative, however, of but a few of the various ways in which the principles of various aspects may be employed, and this description is intended to include all such aspects and their equivalents. Specifically, as used herein, "embodiment," "example," "aspect," "illustration" and the like may not be construed as having any aspect or design better or more advantageous than other aspects or designs.

Hereinafter, regardless of the reference numerals, the same or similar components are assigned the same reference numerals, and redundant descriptions thereof will be omitted. Moreover, in describing embodiments disclosed herein, the detailed description will be omitted when a specific description for related known technologies is judged to obscure the gist of the embodiments disclosed herein. Also, the accompanying drawings are just for easy understanding of embodiments disclosed herein, and the technical spirit disclosed herein is not limited by the accompanying drawings.

Although the terms first, second, etc. may be used herein to describe various devices or elements, it should be appreciated that these devices or elements are not limited by these terms. These terms are used only to distinguish one device or element from another device or element. Thus, it should be appreciated that a first device or element discussed below could be named a second device or element without departing from the teachings of the present invention.

Unless otherwise defined, all terms (including technical and scientific terms) used herein have the same meanings as understood in common by those skilled in the art. Also, terms defined in commonly-used dictionaries should not be interpreted in an idealized or overly formal sense unless expressly so defined herein.

Moreover, the term "or" is intended to mean an inclusive "or" rather than an exclusive "or." That is, unless specified otherwise, or clear from the context, the phrase "X employs A or B" is intended to mean any of the natural inclusive permutations. That is, the phrase "X employs A or B" is satisfied by any of the following instances: X employs A; X employs B; or X employs both A and B. In addition, the term "and/or" used herein should be understood to refer to and include all possible combinations of one or more of the listed related items.

Also, the terms "comprise" and/or "comprising" mean that a corresponding feature and/or element is present but should not be understood as excluding the presence or addition of one or more other features, elements, and/or groups thereof. Also, unless otherwise specified or in cases where it is not clear from the context to designate a singular form, the singular form in the specification and claims should be interpreted as meaning "one or more" in general.

When it is mentioned that a certain element is "coupled to" or "connected to" another element, it should be understood that the certain element may be directly coupled or connected to the other element or still another element may be located therebetween. Conversely, when an element is referred to as being "directly connected" or "directly coupled" to another element, it is to be understood that there are no intervening elements present.

The suffixes "module" and "unit" for elements used in the following description are given or used interchangeably only for ease of writing this specification, and thus do not themselves have distinct meanings or roles.

Also, when it is mentioned that an element or layer is "on" another element or layer, the element or layer may be formed directly on the other element or layer, or a third element or layer may be interposed therebetween. In contrast, when an element is referred to as being "directly on" another element, there are no intervening elements or layers present.

Spatially relative terms, such as "below," "beneath," "lower," "above," and "upper," may be used herein for ease of description to describe the relationship of one element to another element(s) as illustrated in the figures. It is to be understood that the spatially relative terms are intended to encompass different orientations of a device in use or operation, in addition to the orientation depicted in the figures.

For example, an element described as "below" or "beneath" another element could be placed "above" the element if the element shown in the drawing is turned over. Thus, the exemplary term "below" or "beneath" may encompass both orientations of "above" and "below" or "beneath." The element may also be oriented in different directions, and the spatially relative descriptors used herein interpreted accordingly.

Objects and advantages of the present disclosure and technical elements for accomplishing the objects and advantages will be apparent by referring to embodiments described below in detail in connection with the accompanying drawings. In the following description, when the detailed description of the relevant known functions or configurations is determined to unnecessarily obscure the gist of the present invention, the detailed description will be omitted. Also, terms used herein are defined in consideration of functions in the present disclosure and may be changed depending on a user, the intent of an operator, or a custom.

However, the present disclosure is not limited to the following embodiments and may be implemented in various forms. These embodiments are provided only to make the present disclosure complete and to fully inform those skilled in the art of the scope of the disclosure, and the present disclosure is only defined by the scope of the claims. Therefore, the definition should be made based on the contents throughout the specification.

FIG. 1 is a schematic diagram showing a stretchable substrate 100 according to an embodiment of the present disclosure. The stretchable substrate 100 may have a negative Poisson's ratio and may include an auxetic 20 formed through a plurality of unit structures. The auxetic 20 may refer to a mechanical metamaterial having a mechanism for expressing a new mechanical function that did not exist before through the plurality of unit structures. For example, the auxetic 20 which is related to the mechanical metamaterial may have a structure that expands in a vertical direction, which is opposite to that of normal natural stretching.

In detail, the auxetic 20 included in the stretchable substrate 100 may include a plurality of unit structures. In this case, each unit structure is provided through one or more shapes, and thus the auxetic 20 may have a negative Poisson's ratio. Poisson's ratio may refer to the ratio of a transverse strain to a longitudinal strain when a tensile force acts on a material to stretch the material in a specific direction. In other words, the Poisson's ratio may refer to a strain between the transverse direction and the longitudinal direction.

Most materials have a positive Poisson's ratio. This is because the tensile direction and the lateral strain of the material different signs when a tensile force is applied to the material along its short axis. However, when a material is designed to form a specific lattice structure, a negative Poisson's ratio can be achieved macroscopically even if a constituent has a positive Poisson's ratio.

As a specific example, when a transverse stress is applied to a general non-auxetic material, the material stretches in the corresponding transverse direction and contracts longitudinally. That is, a Poisson's ratio between a longitudinal deformation and a transverse deformation due to a vertical stress in the material may be positive.

On the contrary, when a transverse stress is applied to an auxetic material, the material may be stretched both transversely and longitudinally. That is, a Poisson's ratio due to a vertical stress in the material may be negative.

According to an embodiment of the present disclosure, an auxetic 20 forming the stretchable substrate 100 may be generated through the printing process utilizing elastic materials. According to an embodiment, the auxetic 20 may be generated by performing a process of generating a substrate part 10 and performing a printing process on one surface of the generated substrate part 10. The substrate part 10, which is provided to support the auxetic 20 during the auxetic forming process, may be provided in the shape of a thin film and may form a portion of the stretchable substrate 100 after the printing process. That is, the auxetic 20 may be generated by using the substrate part 10 as a support to form (or stack) a plurality of unit structures having a specific shape on the upper side of the substrate part 10 through the printing process utilizing elastic materials.

Also, according to another embodiment, the auxetic 20 of the present disclosure may be generated by performing the printing process on one surface of a fixing surface 40 and removing the fixing surface 40 after curing. The fixing surface 40 may be provided to temporarily support the auxetic 20 during the process of forming the auxetic 20 and may be removed from the auxetic 20 after the printing process. That is, the auxetic 20 may be generated by performing a printing process using a separate fixing surface 40 different from the elements constituting the stretchable substrate 100, and the auxetic 20 of the present disclosure may be generated by separating the generated auxetic 20 from the corresponding fixing surface 40.

In other words, the process of generating the auxetic 20 according to the present disclosure may include at least one of a process of performing a printing process on the substrate part 10 formed of a thin elastomer (i.e., a process in which a substrate part utilized as a support is added to a stretchable substrate) or a process of generating an auxetic by generating an auxetic 20 utilizing a flat fixing surface 40 and then separating the corresponding fixing surface 40 after curing (i.e., a process in which a separate support is separated to manufacture only an auxetic).

Figure 2:
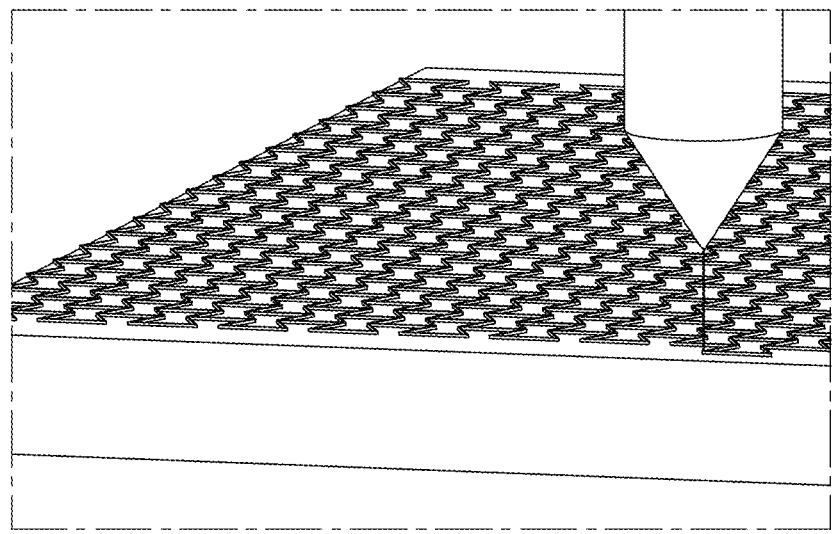
FIG. 2 is an exemplary diagram illustrating a process of manufacturing an auxetic through a printing process according to an embodiment of the present disclosure.

The printing process of the present disclosure, which is a process of imprinting a designed circuit pattern on a target object through an inkjet printer, a laminator, or the like as shown in FIG. 2, may refer to roll-to-roll processing in which a specific lattice structure (i.e., a plurality of unit structures having a specific shape) is formed (or stacked) through a stretchable or elastic material. Such a printing process may refer to a process using equipment such as an inkjet, a pneumatic dispenser, a screw dispenser, a screen printing device, a bar coater, and a spray printing device. The above detailed description of the equipment used in the printing process is only an example, and the present disclosure is not limited thereto.

That is, the auxetic 20 forming the stretchable substrate 100 of the present disclosure may be generated through the printing process utilizing elastic materials. In other words, the printing process may enable an auxetic corresponding to an interval and size of tens to hundreds of microns to be formed. Thus, it is possible to provide a high degree of freedom of design and a high degree of freedom of material and also provide high efficiency in a large-scale process.

As described above, the auxetic 20 of the present disclosure may refer to a material designed to have a negative Poisson's ratio, i.e., such that the transverse strain and the longitudinal strain have the same sign, unlike general materials. In other words, the stretchable substrate 100 of the present disclosure is formed of an auxetic 20, which is a mechanical metamaterial designed with a specific lattice structure, and thus may control a negative Poisson's ratio or a strain in a direction vertical to the stretching direction. The Poisson's ratio is inherently a material-specific property but can be controlled by forming a specific structure in a material. Representative auxetic structures in which the Poisson's ratio can be controlled to be negative may include, for example, a reentrant structure, a rotating rigid body structure, and a chiral structure. The above detailed description of the auxetic structure is only an example, and the present disclosure is not limited thereto.

That is, the stretchable substrate 100 implemented through the auxetic 20 may be a substrate with unique mechanical properties that do not exist in nature by utilizing a new structure. This can present high usability in various fields. For example, the stretchable substrate 100 of the present disclosure may be applied to a flexible device, a wearable device, or the like and utilized to maintain electrical or physical characteristics of the device against external stress. As another example, when the stretchable substrate 100 of the present disclosure is utilized in the display field, the stretchable substrate 100 may support deformation in a multi-dimensional axis direction under various conditions beyond a fixed display that is foldable or rollable in a single direction. This can provide higher variability, thus improving the degree of freedom of design and securing mechanical stability against an external force.

However, when an auxetic structure is used to form a substrate, it may be easy to control a strain on each axis corresponding to two dimensions (e.g., the x-axis or y-axis), and it may be difficult to control deformation in the direction of an axis corresponding to three dimensions perpendicular to the two-dimensional (2D) plane (e.g., the z-axis).

Figure 3:
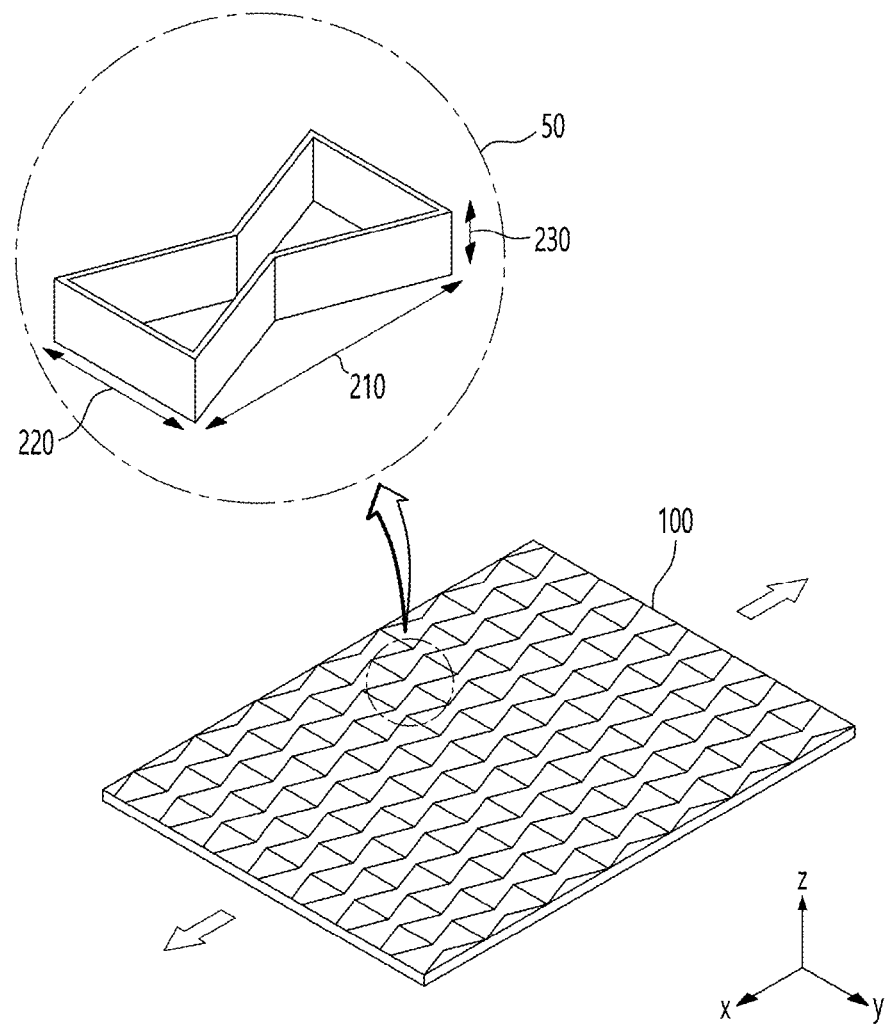
FIG. 3 is an exemplary diagram illustrating a deformation in one axis occurring in relation to an external force generated based on another axis according to an embodiment of the present disclosure.

In detail with reference to FIG. 3, when a tensile force is generated with respect to the x-axis, a general elastic substrate may contract in the direction of the y-axis. On the contrary, the stretchable substrate with the auxetic 20 structure may be stretched or maintained in the y-axis 220 direction in response to an external force with respect to the x-axis 210 since the Poisson's ratio can be controlled to be negative. That is, when a stress is applied in the direction of the x-axis 210, the stretchable substrate may be stretched along both the x-axis 210 and the y-axis 220. However, the stretching in both the x-axis 210 and the y-axis 220 directions may accelerate the contraction in the direction of the z-axis 230. In other words, when an external force for stretching the substrate is generated in the direction of the x-axis 210 or the y-axis 220, contraction may occur rapidly in the direction of the z-axis 230. The deformation (i.e., the contraction) in the direction of the z-axis 230 may cause surface distortion or image quality degradation in the stretchable display field. In addition, the deformation (i.e., the contraction) in the direction of the z-axis 230 may affect the performance of display-related devices disposed adjacent to the substrate surface. In particular, when the performance of devices is directly affected by the shape of the surface, for example, in the case of a display or a solar cell, a solution to the issue may be required.

Accordingly, the stretchable substrate 100 of the present disclosure may control contraction in a three-dimensional (3D) vertical direction (i.e., the direction of the z-axis), thereby preventing wrinkles from occurring on the substrate surface and also thereby securing resolution and visibility. In other words, the stretchable substrate 100 may be designed to control a mechanical deformation distribution generated in response to an external force with respect to one axis in a 2D direction.

Figure 4:
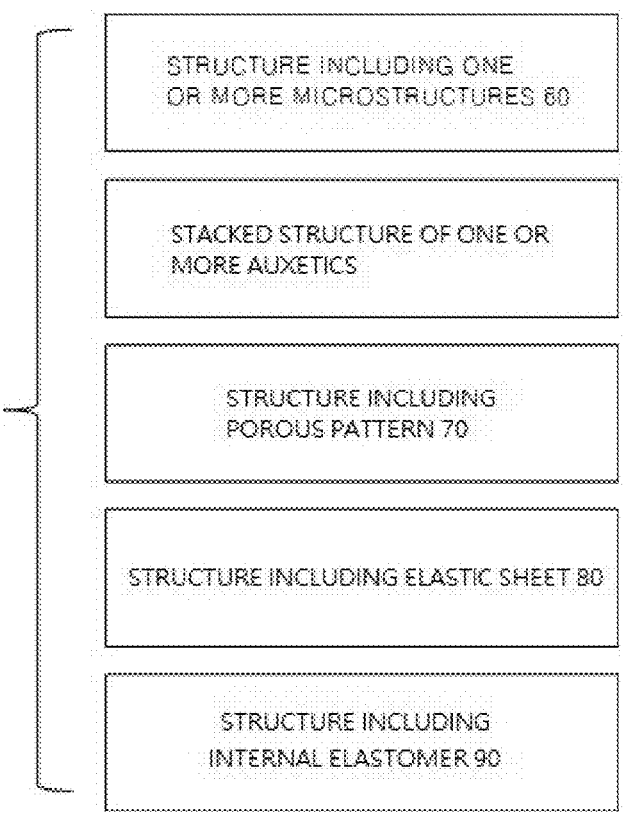
FIG. 4 is an exemplary diagram showing one or more auxetic structures according to an embodiment of the present disclosure.

In detail, the stretchable substrate 100 of the present disclosure is implemented through one or more auxetic structures and thus may control a mechanical deformation distribution generated in a 3D vertical direction to minimize wrinkles on the surface, thereby reducing surface distortion. As shown in FIG. 4, the one or more auxetic structures of the present disclosure may include a structure including one or more microstructures 60, a stacked structure of one or more auxetics, a structure including a porous pattern 70, and a structure including an elastic sheet 80, and a structure including an internal elastomer 90. As described above, the stretchable substrate 100 of the present disclosure may be implemented through one or more auxetic structures and thus can prevent surface wrinkling by distributing a mechanical strain in the z-axis direction toward a lower side of the substrate. Thus, it is possible to prevent display distortion and also prevent damage to adjacent devices.

That is, the stretchable substrate 100 may provide high usability in various fields, and in particular, in relation to the stretchable display field, it may be possible to provide a display with improved resolution or improved quality. More specific manufacturing methods, structural features, and advantageous effects for the stretchable substrate 100 of the present disclosure will be described below with reference to FIGS. 5A to 16.

According to an embodiment of the present disclosure, the stretchable substrate 100 may be implemented through an auxetic structure including one or more microstructures 60. The stretchable substrate 100 including one or more microstructures will be described in detail with reference to FIGS. 5A-5B, 6A-6B, and 7.

The one or more microstructures 60 of the present disclosure may be provided on a surface layer of the substrate to control a mechanical deformation in a 3D axis direction in response to an external force generated with respect to a 2D axis direction. The microstructures 60 may include at least one of a first microstructure 61 and a second microstructure 62. One or more microstructures 60 may be generated through a process of providing a surface layer related to the surface of the substrate and may minimize distortion occurring on the surface by controlling contraction in the direction of the 3D axis (e.g., the z-axis).

Figure 5A:
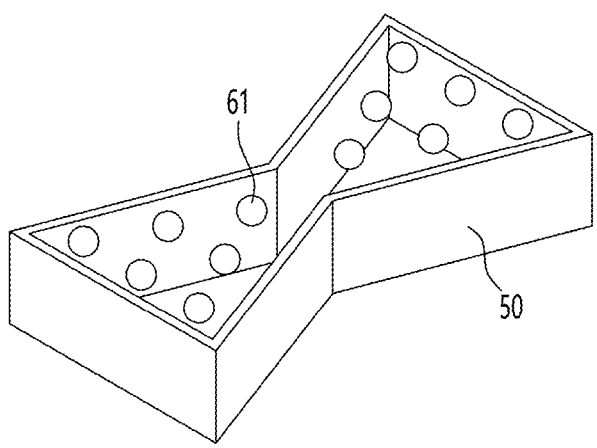
FIGS. 5A and 5B are exemplary diagrams illustrating one or more first microstructures according to an embodiment of the present disclosure.
Figure 5B:
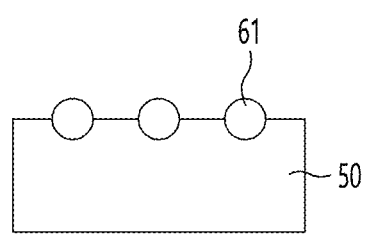

In detail, the one or more microstructures 60 may include one or more first microstructures 61, and the first microstructures 61 may be generated to correspond to the shape and area of each of the plurality of unit structures. For example, the auxetic 20 may be provided through various structures such as a reentrant structure, a rotating rigid body structure, and a chiral structure. The one or more first microstructures 61 may be generated to correspond to various structures of the auxetic 20. As a specific example, when the auxetic 20 is provided through a reentrant structure, one unit structure 50 included in the plurality of unit structures may be provided in the shape of a ribbon as shown in FIG. 5A, and one or more first microstructures 61 may be provided inside the corresponding unit structure 50. In this case, the one or more first microstructures 61 may be provided as an elastomer with a relatively higher Young's modulus (a coefficient indicating how the length of an elastic object changes relative to stress) than another elastomer of which the substrate is formed and may be provided to partially protrude at a position related to the surface layer of the substrate, as shown in FIG. 5B. Also, one or more first microstructures may be at least partially provided in a hemispherical shape and may be produced in a very small size (e.g., in units of microns) so as not to affect visibility.

Accordingly, the one or more first microstructures 61 formed on the surface layer may distribute a mechanical deformation related to the corresponding surface layer in a downward direction. That is, when contraction occurs in the direction of the 3D axis (e.g., the z-axis), the one or more first microstructures 61 formed on the surface layer of the substrate may distribute a mechanical deformation to a lower side to minimize deformation of the corresponding surface layer, thereby reducing surface distortion.

Additionally, as the number of unit structures included in the auxetic 20 or the area of each unit structure increases, the area of a depressed surface may increase upon stretching in the 2D axis direction. That is, the number of unit structures or the area of each unit structure has a correlation with information on the occurrence of distortion on the surface. Accordingly, the first microstructure 61 included in the stretchable substrate 100 of the present disclosure may be generated in proportion to the area or number of unit structures. For example, when the unit area of each of the plurality of unit structures is relatively large, a relatively large number of first microstructures 61 may be formed inside each unit structure. Also, for example, when the number of unit structures is large, a large number of first microstructures 61 may be formed in an auxetic including the corresponding unit structures. That is, in the stretchable substrate of the present disclosure, the numbers and location of first microstructures 61 may be determined based on the area and shape of the plurality of unit structures.

In other words, the stretchable substrate 100 of the present disclosure may control a mechanical stress distribution through the introduction of one or more first microstructures 61. That is, by providing the first microstructure 61 with a high Young's modulus, a mechanical deformation distribution generated with respect to the z-axis may be maximally distributed to a lower side of the substrate through a strain-coupling effect upon stretching in two dimensions. Accordingly, it is possible to minimize surface distortion and prevent damage to a device provided adjacent to the surface.

Also, the one or more microstructures 60 may include one or more second microstructures 62, and the one or more second microstructures 62 may be provided in contact with one inner end surface of each of the plurality of unit structures. The one or more second microstructures 62 may be provided to correspond to the number or shapes of unit structures.

Figure 6A:
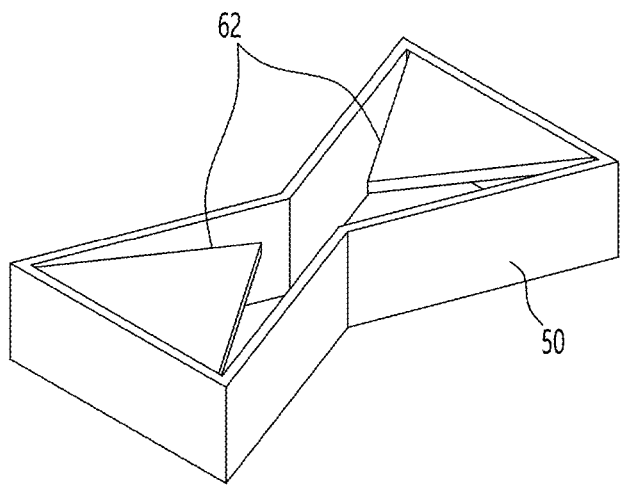
FIGS. 6A and 6B are exemplary diagrams illustrating one or more second microstructures according to an embodiment of the present disclosure.
Figure 6B:
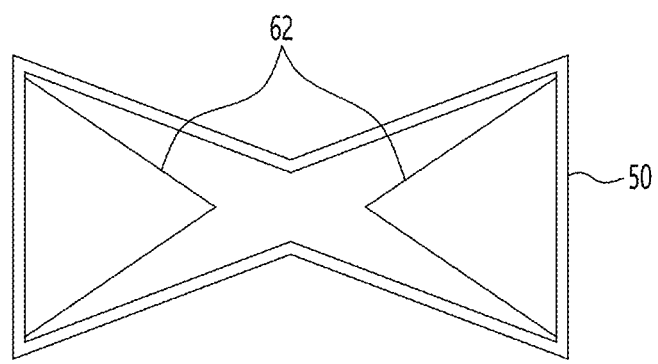

For example, when the auxetic 20 is provided through a reentrant structure, one unit structure 50 included in the plurality of unit structures may be provided in the shape of a ribbon as shown in FIG. 6A, and one or more second microstructures 62 may be provided inside the corresponding unit structure 50. In this case, the one or more second microstructures 62 may be provided in two triangular shapes to correspond to one unit structure 50, as shown in FIG. 6B. Also, one end of each of the two second microstructures may be provided in contact with both ends of the unit structure 50. Here, one end surface of the unit structure on which each of the one or more second microstructures 62 is provided may be one end surface that does not inhibit a mechanical deformation to achieve a negative Poisson's ratio (e.g., one end surface that does not inhibit the ribbon structure from straightening out in FIG. 6B). In other words, the one or more second microstructures 62 may be brought into contact with one inner end surface of each of the plurality of unit structures and may be provided inside each of the plurality of unit structures. When the area of the plurality of unit structures is increased in response to stretching with respect to one axis, the second microstructures 62 may support the surface by supplementing the increased area of the corresponding unit structure. That is, the two second microstructures 62 with a triangular shape act as supports for preventing a surface depression, and thus it is possible to minimize distortion of the surface and prevent damage to a device adjacent to the surface.

In the above description with reference to FIGS. 6A and 6B, an auxetic is formed through a reentrant structure, and thus the second microstructures 62 have been described as being provided in two triangular shapes inside the unit structure. However, it will be obvious to those skilled in the art that the number, shapes, or contact locations of second microstructures can be changed depending on various aspects in which an auxetic is implemented.

A stretchable substrate 100 including one or more microstructures 60 as described above may be generated in the operations shown in FIG. 7. FIG. 7 is a flowchart illustrating a method of manufacturing a stretchable substrate including one or more microstructures 60 according to an embodiment of the present disclosure. According to an embodiment, the method of manufacturing the stretchable substrate may include the following operations. The order of the operations illustrated in FIG. 7 may be changed as needed, and at least one operation may be omitted or added. That is, the operations are just examples of the present disclosure, and the scope of the present disclosure is not limited thereto. Among the features of the illustration in FIG. 7, for the features having been described above with reference to FIGS. 5A-5B and 6A-6B and details described with reference to FIGS. 5A-5B and 6A-6B, a description thereof will be omitted herein.

According to an embodiment of the present disclosure, a method of manufacturing a stretchable substrate including one or more microstructures may include generating an auxetic including a plurality of unit structures (310) and generating one or more microstructures (320).

Here, the one or more microstructures 60 may include one or more first microstructures 61. The one or more first microstructures 61 may be formed to protrude from one surface to correspond to the shape and area of each of the plurality of unit structures.

Specifically, the generating of the one or more microstructures (310) may include generating the one or more first microstructures 61 on a fixing surface 40, forming a substrate part 10 made of an elastic material, and separating the fixing surface 40.

Here, the fixing surface 40 may be provided to temporarily support the corresponding first microstructures 61 during the process of forming the one or more microstructures 60 and may be separated (or removed) from the one or more microstructures 60 after a printing process. In other words, the fixing surface 40 may refer to a separate support that serves to temporarily support the corresponding microstructures during the process of forming the one or more microstructures 60.

A printing process for generating one or more first microstructures 61 on one side of the fixing surface 40 that serves as a temporary support may be performed, and a substrate part 10 may be formed on the one or more microstructures 61. The substrate part 10, which is provided to fix the one or more first microstructures 61, may be provided in the shape of a thin film. Also, the substrate part 10 may be made of an elastic material. That is, the substrate part 10 may be provided in the shape of a thin film that fixes at least a portion of the one or more first microstructures 61.

The substrate part 10 may be formed in one direction of the fixing surface 40 on which the one or more first microstructures 61 are formed and may be brought into contact with the one or more first microstructures 61. Then, curing may be performed. In this case, the performed curing may refer to first curing for coupling (or adhering) the substrate part 10 and the first microstructures 61 and, for example, may refer to low-temperature curing which is performed for 2.5 hours at a temperature of 80 degrees Celsius. Also, by separating the fixing surface 40 after the curing, the substrate part 10 on which the one or more first microstructures 61 are formed may be generated.

In an additional embodiment, the generating of the one or more microstructures 60 (320) may further include processing the fixing surface 40 with a release-preventing agent. In this case, the release-preventing agent may be coated, printed, or applied. The release-preventing agent, which is provided to facilitate separation of the fixing surface 40, may be coated, printed, or applied onto the corresponding fixing surface 40 before the one or more microstructures 60 are formed on the fixing surface 40. That is, through the release-preventing agent applied between the fixing surface 40 and the one or more first microstructures, it is possible to facilitate separation of the substrate part 10 including the one or more first microstructures 61 from the corresponding fixing surface. That is, it is possible to improve the convenience of a delamination process for the one or more first microstructures 61.

Also, the generating of the auxetic (310) may include forming the auxetic 20 on the substrate part 10 including the one or more first microstructures and generating a fixing part 30. In this case, the one or more first microstructures 61 from which the fixing surface 40 is separated may refer to the one or more first microstructures 61 formed on the substrate part 10. That is, the substrate part 10, which is a thin elastic film, may fix the one or more first microstructures 61, and a printing process for auxetic formation may be performed on one surface of the corresponding substrate part 10 while the one or more first microstructures are fixed. Also, the first curing may be performed after the process for auxetic formation is performed on one surface of the substrate part 10. Here, the first curing may refer to curing for coupling (or adhering) between the substrate part 10 and the auxetic 20. Also, second curing may be performed on the substrate part 10 and the auxetic 20 that are coupled to each other through the first curing. In this case, the second curing, which is curing for increasing the mechanical strength of the auxetic 20, may have curing conditions including a longer curing time and a higher curing temperature than the first curing. For example, the second curing may refer to high-temperature curing performed for 24 hours at a temperature of 165 degrees Celsius.

Also, after the second curing is performed, the fixing part 30 may be generated on a substrate part where the auxetic 20 is formed (i.e., a substrate part including an auxetic and one or more first microstructures). Specifically, the fixing part 30 may be supplied in a liquid state to the substrate part 10 coupled to the auxetic 20, and then third curing may be performed. That is, since the third curing is performed after the fixing part 30 made of an elastic material and in a liquid state is supplied to and brought into contact with the substrate part 10 and the auxetic 20, a stretchable substrate including the one or more first microstructures may be generated. In this case, the third curing may refer to curing for coupling (or adhering) between the auxetic 20 and the fixing part 30 and may refer to curing having the same curing conditions as the first curing. That is, through the above-described process, a stretchable substrate including one or more first microstructures formed to protrude from one surface may be generated. In this case, the protruding parts of the one or more first microstructures may form a surface layer of the generated substrate. The one or more first microstructures may be made of an elastomer having a higher Young's modulus than another elastomer of which the stretchable substrate 100 is made and may be provided to correspond to the surface layer of the substrate. Thus, the one or more first microstructures can distribute a mechanical deformation related to the surface layer to a lower side. That is, when contraction occurs in the direction of the 3D axis (e.g., the z-axis), the one or more first microstructures 61 formed on the surface layer of the substrate may distribute a mechanical deformation to the lower side to minimize deformation on the corresponding surface layer, thereby reducing surface distortion.

According to another embodiment of the present disclosure, the generating of the one or more microstructures 60 (320) may include forming a substrate part 10 made of an elastic material and generating the one or more first microstructures 61 on the substrate part 10. In this case, the substrate part 10, which is provided to fix the one or more first microstructures 61, may be provided in the shape of a thin film. Specifically, the substrate part 10 may fix the one or more microstructures 60 and may couple and fix a portion of the auxetic to the one or more microstructures through curing. Also, the substrate part 10 may be made of a material having elasticity. That is, the substrate part 10 may be provided in the shape of a thin film that fixes at least a portion of the one or more first microstructures 61.

Also, the generating of the auxetic 20 (310) may include forming the auxetic 20 on the substrate part 10 including the one or more microstructures 60 and generating the fixing part 30.

Specifically, the printing process for the auxetic 20 may be performed on the substrate part 10 including the one or more microstructures 60, and the first curing may be performed to couple the substrate part 10 to the auxetic 20. Also, the second curing may be performed on the substrate part 10 and the auxetic 20 that are coupled to each other through the first curing. In this case, the second curing may be curing for increasing the mechanical strength of the auxetic 20. Also, after the second curing is performed, the fixing part 30 may be generated on the substrate part 10 where the auxetic 20 is generated.

That is, through the above-described process, a stretchable substrate including one or more first microstructures 61 may be generated. In this case, a process of generating the substrate part 10 by thinly applying an elastomer before the process for the one or more first microstructures and generating one or more first microstructures 61 on one side of the corresponding substrate part 10 is performed, and thus one or more first microstructure 61 may be formed by being included inside the stretchable substrate 100 through the substrate part 10. That is, the one or more first microstructures 61 may be encapsulated, and thus it is possible to prevent the one or more first microstructures 61 from separating from the stretchable substrate 100. Accordingly, it is possible to improve the sustainability of the prevention of device damage and surface distortion of the stretchable substrate 100. In other words, it is possible to improve the operating efficiency of the stretchable substrate 100.

According to still another embodiment of the present disclosure, the generating of the auxetic (310) may include generating the substrate part 10 and forming the auxetic 20 on the substrate part 10. In this case, the generating of the one or more microstructures (320) may include generating the fixing part 30 on the substrate part 10 where the auxetic 20 is formed and forming the one or more first microstructures 61 on the substrate part 10.

In detail, a process of generating the substrate part 10 having the shape of a thin elastic film and forming the auxetic 20 on one surface of the generated substrate part 10 may be performed. After the auxetic formation process is performed on one surface of the substrate part 10, the first curing may be performed. Here, the first curing may refer to curing for coupling between the substrate part 10 and the auxetic 20. Also, the second curing may be performed on the substrate part 10 and the auxetic 20 that are coupled to each other through the first curing. In this case, the second curing, which is curing for increasing the mechanical strength of the auxetic 20, may have curing conditions including a longer curing time and a higher curing temperature than the first curing. For example, the second curing may refer to high-temperature curing performed for 24 hours at a temperature of 165 degrees Celsius.

Also, after the second curing is performed, the fixing part 30 may be generated on the substrate part 10 where the auxetic 20 is formed. Specifically, the fixing part may be supplied in a liquid state to the substrate part 10 coupled to the auxetic 20, and then third curing may be performed. The fixing part 30 made of an elastic material and in a liquid state may be supplied to and brought into contact with the substrate part 10 and the auxetic 20, and then the third curing may be performed. Also, after the third curing is performed, a printing process for forming one or more first microstructures may be performed on the substrate part 10. In this case, the printing process for forming the one or more first microstructures may refer to a process of printing one or more first microstructures, which are at least partly hemispherical, onto the substrate part 10 forming the surface layer. According to an embodiment, through the corresponding printing process, at least some of the one or more first microstructures may be included in the substrate part 10, and at least others may be formed to protrude from the substrate part 10.

That is, as described above, after the process of generating the stretchable substrate 100 is performed through the substrate part 10, the auxetic 20, and the fixing part 30, a process of printing one or more first microstructures 61 onto the substrate part 10 corresponding to the surface layer may be performed to generate a stretchable substrate including the one or more first microstructures.

Also, the one or more microstructures 60 may include one or more second microstructures 62. The one or more second microstructures 62 may be provided in contact with one inner end surface of each of the plurality of unit structures. Also, the one or more second microstructures 62 may be provided to correspond to the number or shapes of unit structures.

The generating of the one or more microstructures (320) may include generating the substrate part 10 and forming the auxetic 20 on the substrate part 10. In this case, the forming of the auxetic 20 on the substrate part 10 may include forming or printing the auxetic including the one or more second microstructures 62.

In detail, a process of generating the substrate part 10 having the shape of a thin elastic film and forming the auxetic 20 on one surface of the generated substrate part 10 may be performed. In this case, the process of forming the auxetic 20 on one surface of the substrate part 10 may be a process of printing the auxetic 20 including the one or more second microstructures 62.

As a specific example, as shown in FIG. 6A, in the case of a process of forming (or printing) an auxetic 20 with a reentrant structure in which each of the plurality of unit structures has a ribbon shape, a process of forming the auxetic 20 such that two second microstructures 62 with a triangular shape are included inside each of the unit structures 50 may be performed. In this case, the one or more second microstructures 62 may be formed in contact with one end surface of each unit structure during the process of forming the auxetic 20. One end surface of the unit structure with which each of the one or more second microstructures 62 is brought into contact may be one end surface that does not inhibit a mechanical deformation to achieve a negative Poisson's ratio (e.g., one end surface that does not inhibit the ribbon structure from straightening out in FIG. 6B). In other words, the process of generating the auxetic 20 including one or more second microstructures 62 brought into contact with one inner end surface of each of the plurality of unit structures may be performed. Accordingly, the one or more second microstructures 62 may be brought into contact with one inner end surface of each of the plurality of unit structures and may be provided inside each of the plurality of unit structures.

When the area of the plurality of unit structures is increased in response to stretching with respect to one axis, the second microstructures 62 may support the surface by supplementing the increased area of the corresponding unit structure. That is, the two second microstructures 62 with a triangular shape act as supports for preventing a surface depression, and thus it is possible to minimize distortion of the surface and prevent damage to a device adjacent to the surface.

Through the above-described processes, the stretchable substrate 100 of the present disclosure may include one or more microstructures on the surface layer. The one or more microstructures 60 may control a mechanical deformation in the 3D axis direction in response to an external force generated with respect to the 2D axis direction. That is, the stretchable substrate 100 can minimize the deformation of the corresponding surface layer upon contraction in the 3D axis direction in response to a tensile force in the 2D axis direction through the one or more microstructures formed on the surface layer. Thus, it is possible to prevent distortion of the surface and prevent damage to an adjacent device.

According to an embodiment of the present disclosure, the stretchable substrate 100 may be implemented through the stacking of one or more auxetics. The stretchable substrate 100 including one or more auxetics will be described below with reference to FIGS. 8, 9, and 10.

Figure 8:
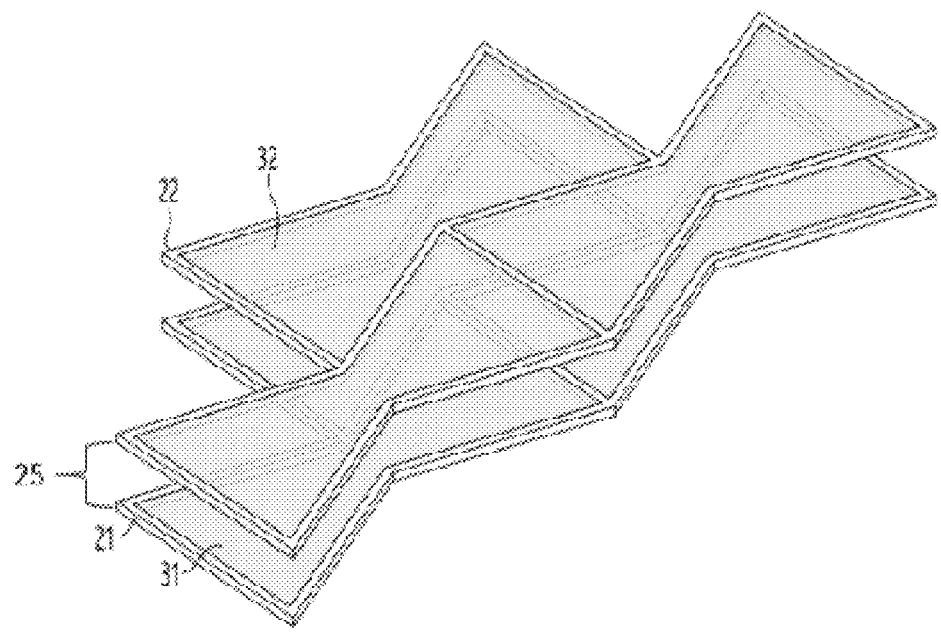
FIG. 8 is an exemplary diagram illustrating a stacked structure of one or more auxetics according to an embodiment of the present disclosure.

In the present disclosure, the stacking of the one or more auxetics may be provided to include stacking at least two or more auxetics to minimize surface wrinkling due to the mechanical deformation in the 3D axis direction. The stacking of the one or more auxetics may include a first auxetic 21 including a plurality of first unit structures and a second auxetic 22 including a plurality of second unit structures, as shown in FIG. 8. Also, an internal elastomer 90 may be filled between the first auxetic 21 and the second auxetic 22. In this case, the internal elastomer 90 may be an elastic material with a negative Poisson's ratio.

For example, when one auxetic is provided, the auxetic itself except the fixing part (e.g., an elastomer) may not be deformed along the 3D axis (i.e., the z-axis) because the auxetic has relatively high strength. That is, by causing only the deformation of the fixing part 30 filled into each of the plurality of unit structures (i.e., the surface is recessed toward each of the plurality of unit structures), surface distortion may occur.

The stretchable substrate 100 of the present disclosure may include one or more stacked auxetics and may include an inner elastic layer placed between the auxetics. That is, the stretchable substrate 100 may be implemented through the stacking of the first auxetic 21 and the second auxetic 22. In this case, an internal elastomer may be filled between the auxetics.

Accordingly, by placing an internal elastomer between the auxetics with relatively high mechanical strength, it may be possible to generate a deformation along the 3D axis (i.e., the z-axis) utilizing the corresponding internal elastomer.

In other words, when a contraction force in the 3D direction occurs in response to stretching in the 2D axis (e.g., the x-axis and y-axis) direction, it may be possible to generate a deformation in the 3D axis direction corresponding to the corresponding contraction force by utilizing the internal elastomer. This causes the surface to be collectively recessed through the contraction of the internal elastomer provided between the auxetics, and thus it is possible to prevent the deformation of only the fixing part 30 (i.e., an elastomer with relatively low mechanical strength). That is, by causing collective contraction through the internal elastomer between the one or more auxetics, it is possible to reduce distortion of the surface and prevent damage to a device disposed adjacent to the surface.

Specifically, the stretchable substrate 100 may include a first auxetic 21 including a plurality of first unit structures 51 and a first fixing part 31 for fixing the first auxetic 21. Also, the stretchable substrate 100 may further include a substrate part 10 formed of an elastic material. In this case, the substrate part 10 may be provided in the shape of a thin film to support the first auxetic 21 during the process of forming the first auxetic 21. That is, the first auxetic 21 may be formed on the substrate part 10.

Also, the stretchable substrate 100 may include a second auxetic 22 including a plurality of second unit structures 52 and a second fixing part 32 for fixing the second auxetic 22. In this case, the second auxetic 22 may be formed on the first fixing part 31 and stacked on the first auxetic 21.

According to an embodiment, the second unit structure 52 included in the second auxetic 22 may have a different size from the first unit structure 51 included in the first auxetic. In detail, the first auxetic 21 and the second auxetic 22 may be fixed through the first fixing part 31 and the second fixing part 32, respectively. In this case, the auxetics may have higher mechanical strength than the fixing parts. For example, the auxetics may be cured through curing conditions different from those for the fixing parts, and thus the auxetics may have higher mechanical strength than the fixing parts. In detail, since the auxetics have a higher curing agent ratio than the fixing parts and are cured under curing conditions including a long curing time and a high curing temperature, the auxetics may have higher mechanical strength than the fixing parts.

That is, the first auxetic 21 and the second auxetic 22 may have higher mechanical strength than the first fixing part 31 and the second fixing part 32, respectively. Accordingly, the first auxetic 21 and the second auxetic 22 may not be deformed along the 3D axis. That is, by causing only the deformation of the first fixing part 31 and the second fixing part 32 filled into the plurality of unit structures included in each auxetic, surface distortion may be generated.

Accordingly, in order to minimize contraction in the 3D axis direction through the fixing parts, the second unit structure 52 and the first unit structure 51 may have different sizes. That is, the second unit structure 52 included in the second auxetic 22 may have a different size from the first unit structure 51 included in the first auxetic 21. Accordingly, when the first auxetic 21 and the second auxetic 22 are stacked, the first unit structure 51 and the second unit structure 52 may not correspond to each other. For example, at least some of the plurality of second unit structures may be located in an inner space formed by the plurality of first unit structures.

That is, since the contraction direction of the first fixing part 31 does not correspond to that of the second fixing part 32, the contraction in the 3D axis direction may be minimized through the first auxetic 21 and the second auxetic 22 which have relatively high mechanical strength.

Figure 9:
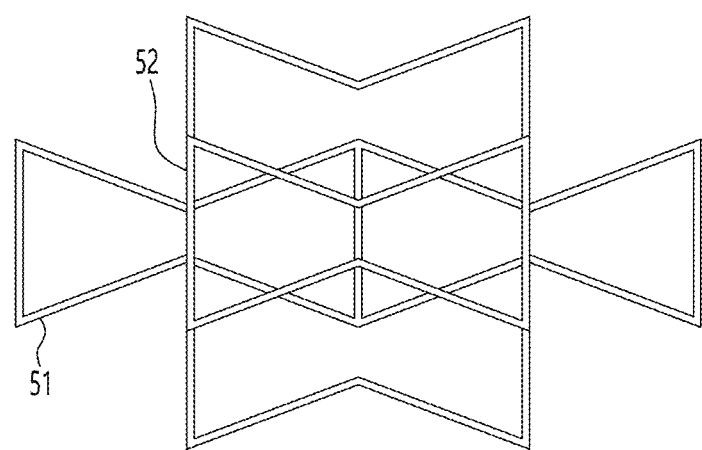
FIG. 9 is an exemplary diagram of a top view of a stacked structure of one or more auxetics according to an embodiment of the present disclosure.

Also, according to an embodiment, the second auxetic 22 may be stacked on the first auxetic 21 such that the plurality of second unit structures 52 are offset from the plurality of first unit structures. When the auxetics are stacked such that the plurality of second unit structures 52 are offset from the plurality of first unit structures 51, the first fixing part 31 and the second fixing part 32 have different formation directions, and thus it is possible to reduce contraction in the 3D direction. As a specific example, as shown in FIG. 9, when the first unit structures 51 and the second unit structures are stacked to be offset from each other, the first fixing part 31 and the second fixing part 32 filled into the first unit structure 51 and the second unit structure 52 do not correspond to each other, and thus the contraction in the z-direction may be reduced by each auxetic. Accordingly, the contraction in the 3D axis direction may be controlled, and thus it is possible to reduce surface distortion.

Also, the stretchable substrate 100 may include an inner elastic layer provided between the first auxetic 21 and the second auxetic 22. That is, the stretchable substrate 100 of the present disclosure may include one or more stacked auxetics and may be implemented by filling the internal elastomer 90 between the auxetics.

Accordingly, by placing an internal elastomer between the auxetics with relatively high mechanical strength, it may be possible to generate a deformation along the 3D axis (i.e., the z-axis) utilizing the corresponding internal elastomer.

In other words, when a contraction force in the 3D direction occurs in response to stretching in the 2D axis (e.g., the x-axis and y-axis) direction, it may be possible to generate a deformation in the 3D axis direction corresponding to the corresponding contraction force by utilizing the internal elastomer. This causes the surface to be collectively recessed through the contraction of the internal elastomer provided between the auxetics, and thus it is possible to prevent surface wrinkling from occurring through the contraction of the fixing part. That is, by causing collective contraction through the internal elastomer between the one or more auxetics, it is possible to reduce distortion of the surface and prevent damage to a device disposed adjacent to the surface.

Figure 10:
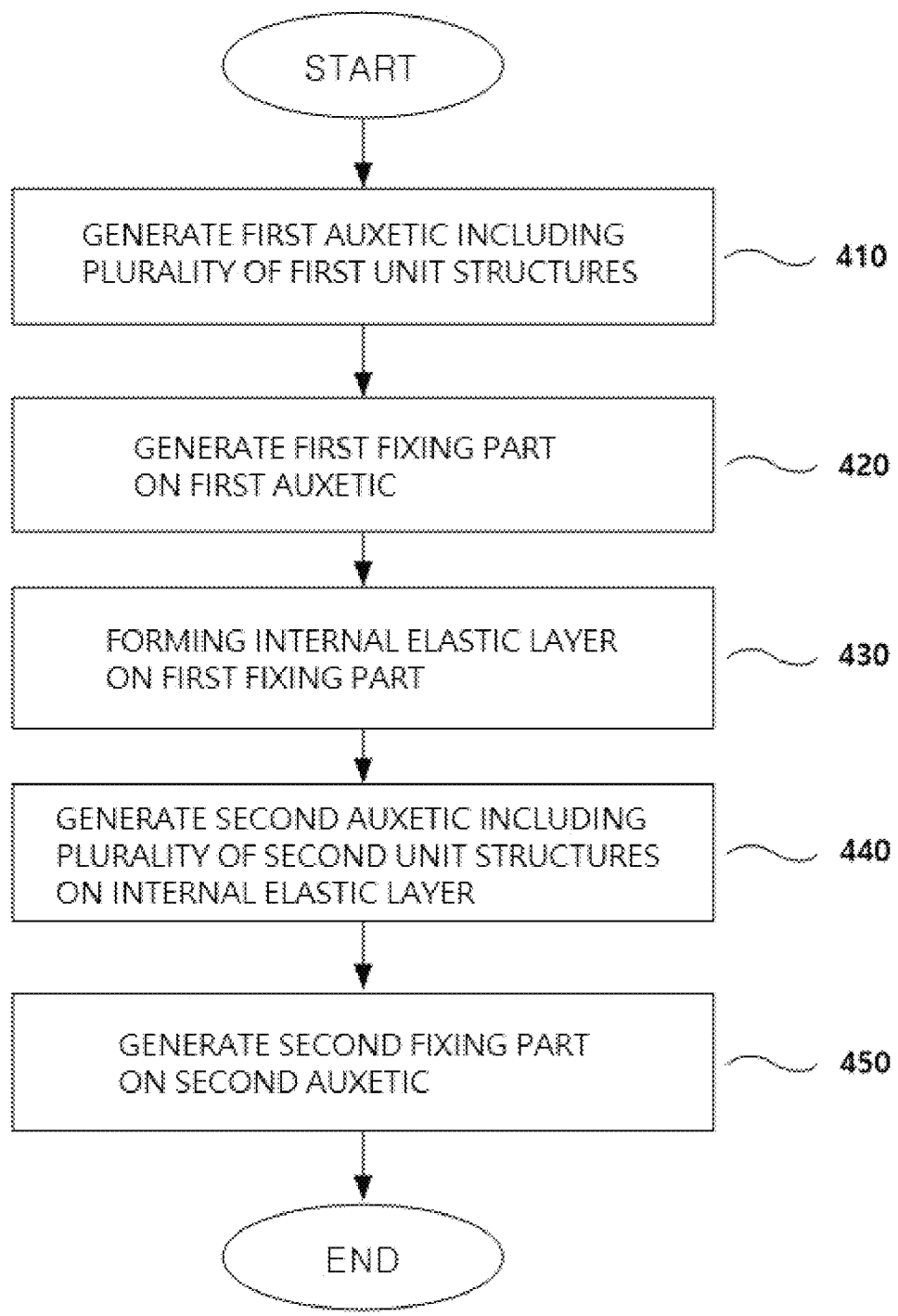
FIG. 10 is a flowchart illustrating a method of manufacturing a stretchable substrate including a stacked structure of one or more auxetics according to an embodiment of the present disclosure.

A stretchable substrate 100 including one or more microstructures as described above may be generated by the operations shown in FIG. 10. FIG. 10 is a flowchart illustrating a method of manufacturing a stretchable substrate implemented through the stacking of one or more auxetics according to an embodiment of the present disclosure. According to an embodiment, the method of manufacturing the stretchable substrate may include the following operations. The order of the operations illustrated in FIG. 10 may be changed as needed, and at least one operation may be omitted or added. That is, the operations are just examples of the present disclosure, and the scope of the present disclosure is not limited thereto. Among the features of the illustration in FIG. 10, for the features having been described above with reference to FIGS. 8 and 9 and details described with reference to FIGS. 8 and 9, a description thereof will be omitted herein.

According to an embodiment of the present disclosure, the method of manufacturing the stretchable substrate implemented through the stacking of one or more auxetics may include generating a first auxetic including a plurality of first unit structures (410), generating a first fixing part on the first auxetic (420), forming an inner elastic layer on the first fixing part (430), generating a second auxetic including a plurality of second unit structures on the inner elastic layer (440), and generating a second fixing part on the second auxetic (450).

According to an embodiment of the present disclosure, the generating of the first auxetic (410) may include generating a first auxetic 21 on a fixing surface 40 and separating the fixing surface 40. Here, the fixing surface 40 may be provided to temporarily support the corresponding first auxetic 21 during the process of generating the first auxetic 21 including the plurality of first unit structures. After a printing process, the fixing surface 40 may be separated from the first auxetic 21. In other words, the fixing surface 40 may refer to a separate support that serves to temporarily support the corresponding first auxetic 21 during the process of forming the first auxetic 21. After the process of generating the first auxetic 21 on one side of the fixing surface 40, curing may be performed. In this case, the performed curing may be curing for increasing the mechanical strength of the first auxetic 21.

According to another embodiment of the present disclosure, the generating of the first auxetic (410) may include generating a substrate part 10 and generating the first auxetic 21 in the substrate part 10. Specifically, a process of generating the substrate part 10 having the shape of a thin elastic film and forming the first auxetic 21 on one surface of the generated substrate part 10 may be performed. Also, after the process of generating the first auxetic 21, curing for increasing the mechanical strength of the corresponding auxetic 20 may be performed.

According to another embodiment, the generating of the first auxetic 21 (410) may include generating a first auxetic 21 including a porous pattern 70. The porous pattern may be formed to include one or more holes including an inner space layer. Specifically, the generating of the first auxetic 21 may include generating the substrate part 10 and generating the first auxetic 21 including the porous pattern on the substrate part 10. Accordingly, the first auxetic 21 may include a porous pattern formed to include one or more holes. This may enable the first auxetic to contract through one or more holes in response to the contraction force in the 3D axial direction. That is, deformation along the 3D axis (i.e., the z-axis) may be possible by utilizing the one or more holes formed in the first auxetic 21. In other words, when a contraction force in the 3D direction occurs in response to stretching in the 2D axis (e.g., the x-axis and y-axis) direction, it is possible to minimize surface distortion by utilizing the porous pattern included in the first auxetic to enable deformation in the 3D axis direction corresponding to the contraction force (i.e., distributing stress to a lower side).

Also, after the first auxetic 21 is generated, the first fixing part 31 in a liquid state is supplied to and brought into contact with the auxetic 20, and then curing for coupling between the first fixing part 31 and the auxetic 20 may be performed. After the corresponding curing is performed, a process of forming the inner elastic layer on the first fixing part 31 may be performed. In this case, the inner elastic layer, which is formed through the supply of the internal elastomer, may refer to a layer located between the first auxetic 21 and the second auxetic 22. According to an embodiment, the internal elastomer may be an elastic material with lower mechanical strength than that of the first fixing part 31 or the second fixing part 32. Accordingly, contraction of the inner elastic layer occurs preferentially in response to the contraction force in the 3D axis direction, and thus it is possible to induce collective contraction of the substrate surface.

Also, after the inner elastic layer is formed, the second auxetic 22 including the plurality of second unit structures 52 may be formed on an upper side of the inner elastic layer. After the second auxetic 22 is formed on the inner elastic layer, curing for increasing the mechanical strength of the second auxetic 22 may be performed. Also, after the corresponding curing, the second fixing part 32 in a liquid state may be supplied to the second auxetic 22 formed on the inner elastic layer. After the second fixing part 32 is supplied, curing for coupling between the second auxetic 22 and the second fixing part 32 may be performed.

Accordingly, the stretchable substrate 100 including the inner elastic layer between the auxetics with relatively high mechanical strength may be generated. Accordingly, it may be possible to generate a deformation along the 3D axis (i.e., the z-axis) utilizing the internal elastomer located between the auxetics.

In other words, when a contraction force in the 3D direction occurs in response to stretching in the 2D axis (e.g., the x-axis and y-axis) direction, it may be possible to generate a deformation in the 3D axis direction corresponding to the corresponding contraction force by utilizing the internal elastomer. This causes the surface to be collectively recessed through the contraction of the internal elastomer provided between the auxetics, and thus it is possible to prevent surface wrinkling from occurring through the contraction of the fixing part. That is, by causing collective contraction through the internal elastomer between the one or more auxetics, it is possible to reduce surface distortion and prevent damage to a device disposed adjacent to the surface.

According to an embodiment of the present disclosure, the stretchable substrate 100 may be implemented through an auxetic including the porous pattern 70. The stretchable substrate 100 including the porous pattern will be described in detail with reference to FIGS. 11 and 12.

Figure 11:
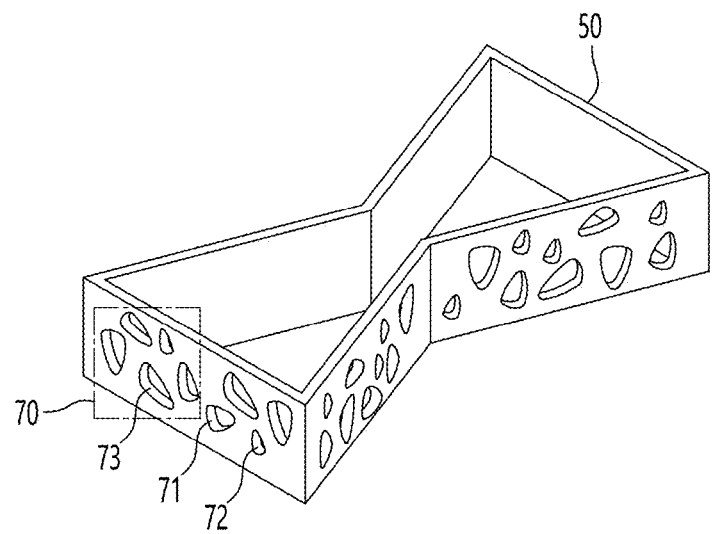
FIG. 11 is an exemplary diagram illustrating a porous pattern according to an embodiment of the present disclosure.

In the present disclosure, the porous pattern may be for minimizing surface wrinkling corresponding to the mechanical deformation in the 3D axis direction by forming one or more holes including the inner space layer in the corresponding auxetic during the auxetic formation process. The porous pattern 70 may refer to one or more holes 71, 72, and 73 formed in the auxetic 20, as shown in FIG. 11.

For example, the auxetic 20 may be provided with relatively higher mechanical strength than that of the fixing part 30 filled into the unit structure 50. Accordingly, when a contraction force in the 3D axis direction occurs in response to a tensile force related to the 2D axis, only elastomer parts (i.e., fixing parts) other than the auxetic 20 may contract. That is, by causing only the deformation of the fixing part 30 filled into each of the plurality of unit structures included in the auxetics (i.e., the surface is recessed toward each of the plurality of unit structures), surface distortion may occur.

Accordingly, the stretchable substrate 100 of the present disclosure may include the porous pattern 70 formed to include one or more holes in the auxetic 20. This may enable the auxetic 20 to contract through one or more holes in response to the contraction force in the 3D axial direction. That is, it may be possible to generate a deformation along the 3D axis (i.e., the z-axis) by utilizing the one or more holes formed in the auxetic 20. In other words, when a contraction force in the 3D direction occurs in response to stretching in the 2D axis (e.g., the x-axis and y-axis) direction, it is possible to minimize surface distortion by utilizing the porous pattern included in the first auxetic to enable the deformation in the 3D axis direction corresponding to the corresponding contraction (i.e., distributing a strain to a lower side).

Figure 12:
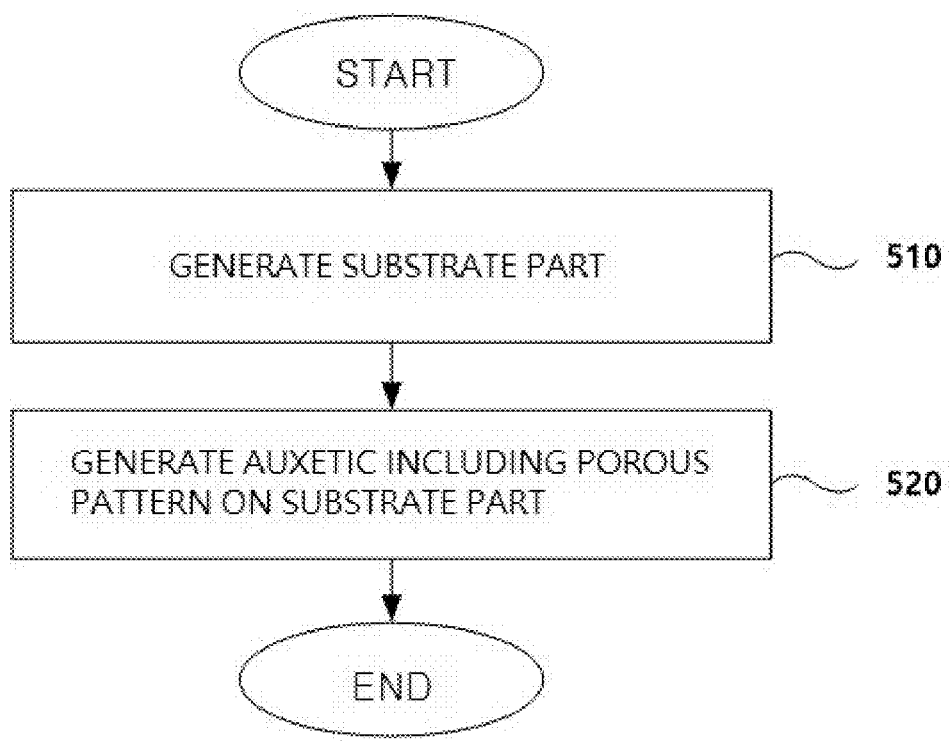
FIG. 12 is a flowchart illustrating a method of manufacturing a stretchable substrate including a porous pattern according to an embodiment of the present disclosure.

A stretchable substrate 100 including a porous pattern as described above may be generated by the operations shown in FIG. 12. FIG. 12 is a flowchart illustrating a method of manufacturing a stretchable substrate including a porous pattern according to an embodiment of the present disclosure. According to an embodiment, the method of manufacturing the stretchable substrate may include the following operations. The order of the operations illustrated in FIG. 12 may be changed as needed, and at least one operation may be omitted or added. That is, the operations are just examples of the present disclosure, and the scope of the present disclosure is not limited thereto. Among the features of the illustration in FIG. 12, for the features having been described above with reference to FIGS. 1 to 11 and details described with reference to FIGS. 1 to 11, a description thereof will be omitted herein.

According to an embodiment of the present disclosure, the method of manufacturing the stretchable substrate including the porous pattern may include generating a substrate part 10 (510) and generating an auxetic including a porous pattern on the substrate part 10 (520).

Specifically, a process of generating the substrate part 10 having the shape of a thin elastic film and forming an auxetic 20 on one surface of the generated substrate part 10 may be performed. In this case, the process of forming the auxetic 20 on one surface of the substrate part 10 may refer to a process of forming the auxetic 20 to include a porous pattern forming one or more holes including an inner space. After the process for the auxetic 20 including the porous pattern is performed on the substrate part 10, first curing for coupling between the substrate part 10 and the auxetic 20 including the porous pattern may be performed. Also, after the first curing is performed, second curing for increasing the mechanical strength of the auxetic 20 may be performed. After the second curing, a fixing part 30 may be supplied to the auxetic including the porous pattern. After the fixing part 30 is supplied, third curing for coupling between the fixing part 30 and the auxetic 20 may be performed.

Accordingly, the stretchable substrate 100 including the porous pattern may be generated. The stretchable substrate 100 of the present disclosure may enable deformation (e.g., contraction) through one or more holes in response to the contraction force in the 3D axis direction. In other words, when a contraction force in the 3D direction occurs in response to stretching in the 2D axis (e.g., the x-axis and y-axis) direction, it may be possible to generate a deformation in the 3D axis direction corresponding to the corresponding contraction force by utilizing the porous pattern included in the auxetic, and thus it is possible to minimize surface distortion.

According to an embodiment of the present disclosure, the stretchable substrate 100 may be implemented through an auxetic structure including one or more elastic sheets 80. The stretchable substrate 100 including the one or more elastic sheets 80 will be described below with reference to FIGS. 13 and 14.

In the present disclosure, the elastic sheet 80 may be for minimizing surface wrinkling due to a mechanical deformation in the 3D axis direction by being provided in a thickness equal to or less than a predetermined thickness so that the overall thickness of the elastic sheet 80 is decreased. In detail, as the thickness of the substrate decreases, the actual Poisson's ratio may decrease. Accordingly, the stretchable substrate 100 can minimize the mechanical deformation occurring in the 3D axis direction by reducing the overall thickness through the elastic sheet having a predetermined thickness or less. Accordingly, it is possible to reduce surface distortion.

In detail, the stretchable substrate 100 may include an auxetic 20 including a plurality of unit structures, a fixing part 30 for fixing the auxetic, and one or more elastic sheets 80 to be adhered to one side of the auxetic 20.

One or more elastic sheets may be generated to have a predetermined thickness or less and adhered to one surface of the auxetic. Thus, it is possible to control a strain along another axis in response to an external force generated based on one axis. That is, by reducing the overall thickness of the substrate, the elastic sheet 80 can minimize the mechanical deformation occurring in the 3D axis direction.

Also, the stretchable substrate 100 may further include a fixing surface 40 that temporarily supports the auxetic 20. In this case, the fixing surface 40 may be separated after the process of forming the auxetic 20. That is, the fixing surface 40 may refer to a separate support that serves to temporarily support the corresponding auxetic 20 during the process of forming the auxetic 20.

In an additional embodiment, the stretchable substrate 100 may further include a substrate part made of an elastic material. In this case, the auxetic 20 may be formed on the corresponding substrate part 10.

Also, the stretchable substrate 100 may further include an adhesive or an elastic liquid for adhering one or more elastic sheets 80 to one surface of the auxetic 20. That is, the one surface of the auxetic 20 and the one or more elastic sheets may be adhered to each other through the adhesive or the elastic liquid. According to an embodiment, when the one or more elastic sheets 80 are adhered to the auxetic 20 through the elastic liquid, separate curing may be performed to achieve adhesion through the corresponding elastic liquid.

Figure 14:
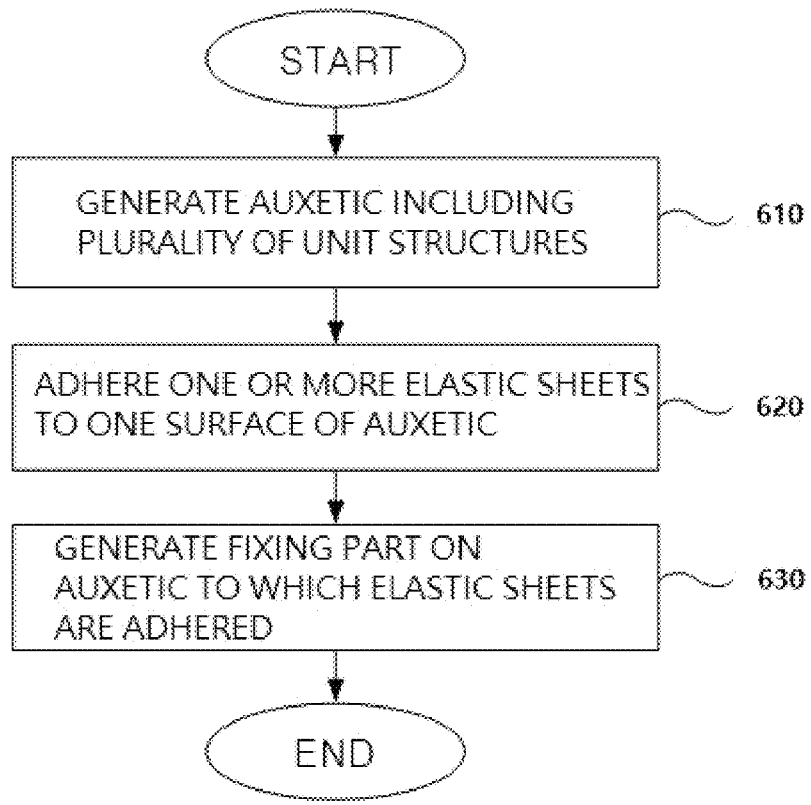
FIG. 14 is a flowchart illustrating a method of manufacturing a stretchable substrate including one or more elastic sheets according to an embodiment of the present disclosure.

As described above, the stretchable substrate 100 including the one or more elastic sheets 80 may be generated by the operations shown in FIG. 14. FIG. 14 is a flowchart illustrating a method of manufacturing a stretchable substrate including one or more elastic sheets according to an embodiment of the present disclosure. According to an embodiment, the method of manufacturing the stretchable substrate may include the following operations. The order of the operations illustrated in FIG. 14 may be changed as needed, and at least one operation may be omitted or added. That is, the operations are just examples of the present disclosure, and the scope of the present disclosure is not limited thereto. Among the features of the illustration in FIG. 14, for the features having been described above with reference to FIGS. 1 to 12 and details described with reference to FIGS. 1 to 12, a description thereof will be omitted herein.

According to an embodiment of the present disclosure, a method of manufacturing a stretchable substrate including an elastic sheet may include generating auxetic including a plurality of unit structures (610), adhering one or more elastic sheets to one surface of the auxetic (620), and forming a fixing part on the auxetic to which the elastic sheets are adhered (630).

Specifically, the generating of the auxetic (610) may include generating an auxetic on a fixing surface, forming a fixing part, performing curing, and separating the fixing surface. Here, the fixing surface 40 may be provided to temporarily support the corresponding auxetic during the process of forming the auxetic and may be separated after the process of forming the auxetic.

The process of forming the auxetic 20 on one side of the fixing surface 40 may be performed, and the fixing part 30 in a liquid state may be supplied after the process of forming the auxetic 20. After the fixing part 30 in a liquid state is supplied, first curing for coupling between the fixing part 30 and the auxetic 20 may be performed. Also, after the first curing is performed, second curing for increasing the mechanical strength of the auxetic 20 may be performed. After the second curing, the fixing surface 40 may be separated to generate the auxetic 20 including the fixing part 30 inside each of the plurality of unit structures.

Also, the adhering of the one or more elastic sheets to one surface of the auxetic (620) may include applying an adhesive or an elastic liquid to the auxetic and attaching the one or more elastic sheets to the auxetic. In this case, the adhering of the one or more elastic sheets to the one surface of the auxetic may further include performing curing. For example, when the one or more elastic sheets 80 are adhered to the auxetic 20 through the elastic liquid, separate curing may be performed to achieve adhesion (or coupling) through the corresponding elastic liquid.

Figure 13:
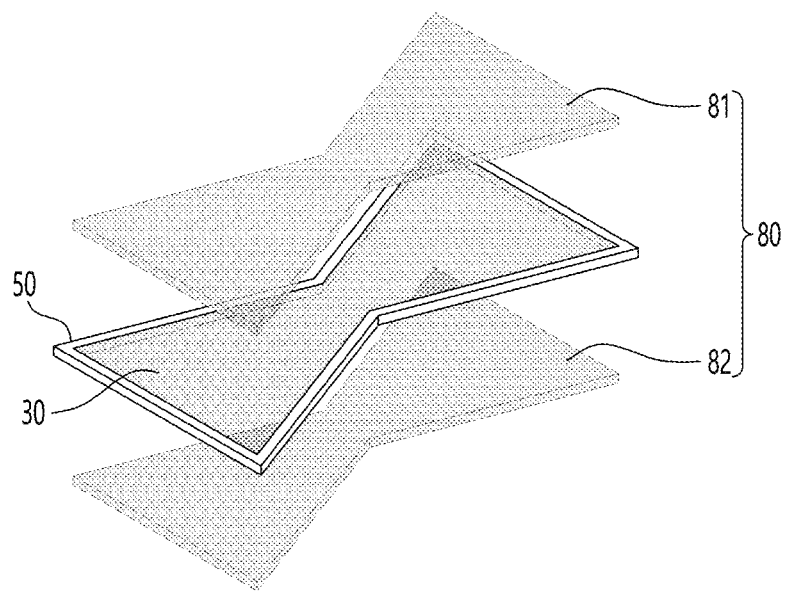
FIG. 13 is an exemplary diagram illustrating one or more elastic sheets according to an embodiment of the present disclosure.

According to an embodiment of the present disclosure, the one or more elastic sheets may be attached to both surfaces of the auxetic. For example, as shown in FIG. 13, the one or more elastic sheets 80 may include a first elastic sheet 81 and a second elastic sheet 82, and the elastic sheets may be attached to an upper surface and a lower surface of the auxetic.

In this case, since the elastic sheets are formed on both sides of the auxetic, auxetic encapsulation may be possible. This may improve the sustainability of the prevention of device damage and surface distortion of the stretchable substrate 100. In other words, it is possible to improve the operating efficiency of the stretchable substrate 100.

In the above-described manufacturing operation, the stretchable substrate 100 including one or more elastic sheets may be generated. That is, the stretchable substrate 100 of the present disclosure may be generated through a process of providing the plurality of auxetics (i.e., including the fixing part 30 inside each of the plurality of unit structures) and the plurality of elastic sheets and adhering the one or more elastic sheets to each auxetic. This process may provide high process efficiency, such as providing manufacturing convenience in terms of mass production. Also, the stretchable substrate including the one or more elastic sheets can minimize the mechanical deformation occurring in the 3D axis direction by reducing the overall thickness through an elastic sheet with a predetermined thickness or less. This can provide an effect of preventing device damage and wrinkle occurrence on a surface layer.

According to an embodiment of the present disclosure, the stretchable substrate 100 may be implemented through an auxetic including the internal elastomer 90. The stretchable substrate 100 including the internal elastomer will be described below with reference to FIGS. 15 and 16.

Figure 15:
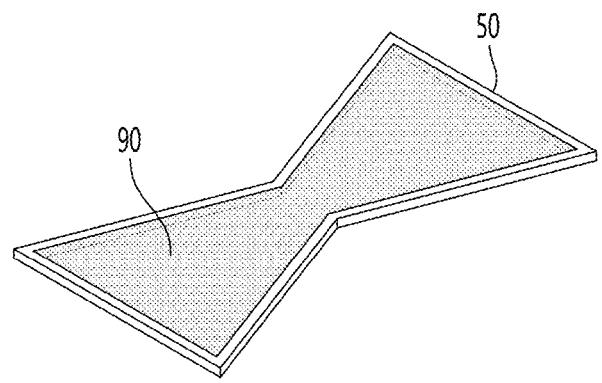
FIG. 15 is an exemplary diagram illustrating an internal elastomer according to an embodiment of the present disclosure.

In the present disclosure, the internal elastomer 90 is made of an elastic material with a negative Poisson's ratio and is filled into at least some of a plurality of unit structures, and thus it is possible to minimize surface wrinkling due to mechanical deformation in the 3D axis direction. Specifically, the stretchable substrate 100 may include an internal elastomer 90 with a Poisson's ratio close to zero in each of the plurality of unit structures. For example, as shown in FIG. 15, the internal elastomer may be filled into the inner direction of the unit structure and may be stretched in response to contraction in the 3D axis direction to support the surface. For example, when the corresponding substrate is stretched in the 2D axis direction, the internal elastomer 90 filled into at least some of the plurality of unit structures may swell in the 3D axis direction to support the surface being contracted. That is, by providing an internal elastomer, which is a mechanical metamaterial with a negative Poisson's ratio, inside each unit structure 50, it is possible to prevent surface wrinkling from occurring when a contraction force acts in the 3D direction.

In detail, the stretchable substrate 100 may include an auxetic 20 including a plurality of unit structures and an internal elastomer 90 filled into each of the plurality of unit structures.

The internal elastomer 90 is made of an elastic material with a negative Poisson's ratio and is filled into at least some of a plurality of unit structures, and thus it is possible to minimize surface wrinkling due to the mechanical deformation in the 3D axis direction. For example, the internal elastomer 90 may have a Poisson's ratio close to zero and may be stretched in another axis direction in response to an external force generated based on one axis direction.

Also, the stretchable substrate 100 may further include a fixing surface 40 that temporarily supports the auxetic 20. In this case, the fixing surface 40 may be separated after the process of forming the auxetic 20. That is, the fixing surface 40 may refer to a separate support that serves to temporarily the corresponding auxetic 20 during the process of forming the auxetic 20.

In an additional embodiment, the stretchable substrate 100 may further include a substrate part formed of an elastic material. In this case, the auxetic 20 may be formed on the corresponding substrate part 10.

Figure 16:
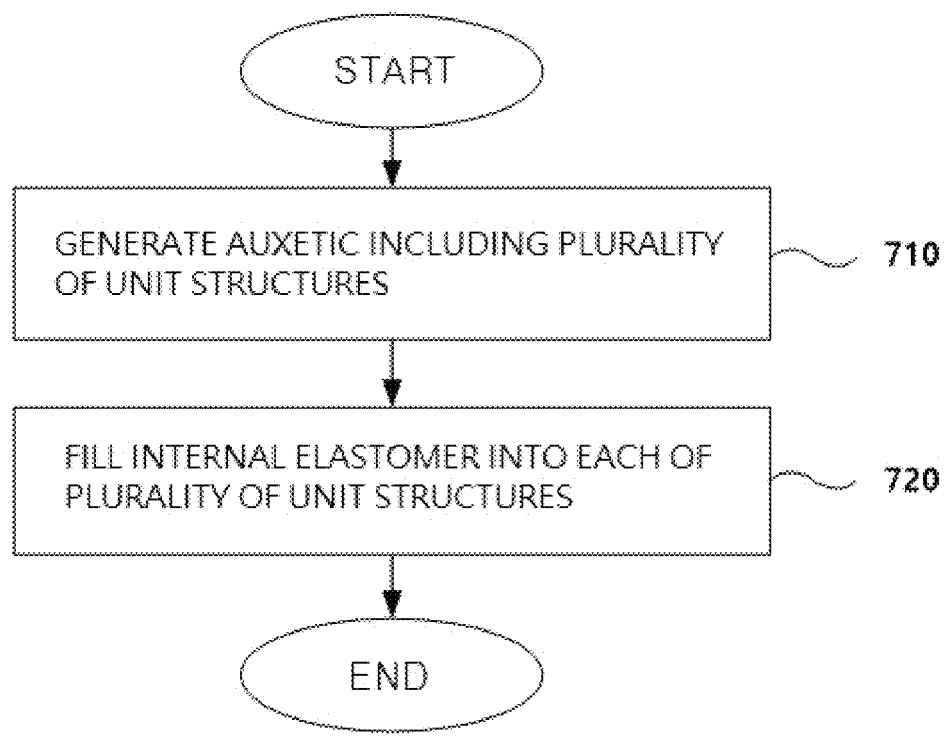
FIG. 16 is a flowchart illustrating a method of manufacturing a stretchable substrate including an internal elastomer according to an embodiment of the present disclosure.

A stretchable substrate including an internal elastomer as described above may be generated by operations shown in FIG. 16. FIG. 16 is a flowchart illustrating a method of manufacturing a stretchable substrate including an internal elastomer according to an embodiment of the present disclosure. According to an embodiment, the method of manufacturing the stretchable substrate may include the following operations. The order of the operations illustrated in FIG. 16 may be changed as needed, and at least one operation may be omitted or added. That is, the operations are just examples of the present disclosure, and the scope of the present disclosure is not limited thereto. Among the features of the illustration in FIG. 16, for the features having been described above with reference to FIGS. 1 to 15 and details described with reference to FIGS. 1 to 15, a description thereof will be omitted herein.

According to an embodiment of the present disclosure, a method of manufacturing a stretchable substrate including an internal elastomer 90 may include generating an auxetic including a plurality of unit structures (710) and filling an internal elastomer into each of the plurality of unit structures (720).

According to an embodiment of the present disclosure, the generating of the auxetic 20 (710) may include generating an auxetic including a plurality of unit structures on a fixing surface 40 and filling an internal elastomer into each of the plurality of unit structures.

Specifically, the process of forming the auxetic 20 on one side of the fixing surface 40 may be performed, and the internal elastomer 90 may be filled after the process of forming the auxetic 20. After the internal elastomer 90 is filled, first curing for coupling between the internal elastomer 90 and the auxetic 20 may be performed. Also, after the first curing is performed, second curing for increasing the mechanical strength of the auxetic 20 may be performed. After the second curing, the fixing surface 40 may be separated to generate the auxetic 20 including the internal elastomer 90 inside each of the plurality of unit structures.

According to another embodiment of the present disclosure, the generating of the auxetic 20 (710) may include generating a substrate part 10, generating an auxetic including a plurality of unit structures on the substrate part 10, and filling an internal elastomer into each of the plurality of unit structures.

In the above-described manufacturing operation, the stretchable substrate 100 including the internal elastomer 90 may be generated. That is, the stretchable substrate 100 may have the internal elastomer 90 inside at least some of the plurality of unit structures, and thus it is possible to minimize surface wrinkling due to the mechanical deformation in the 3D axis direction. In other words, by providing an internal elastomer, which is a mechanical metamaterial with a negative Poisson's ratio, inside each unit structure 50, the surface may be supported through the corresponding internal elastomer when a contraction force acts in the 3D direction, and thus it is possible to prevent surface wrinkling.

According to various embodiments of the present disclosure, the present disclosure can provide a stretchable substrate that can be freely used by being deformed in multi-dimensional axis directions under various conditions. Also, the present disclosure can provide a stretchable substrate with high transmittance as well as a stable mechanical strain. In addition, when the substrate is stretched based on one axis, it is possible to reduce screen distortion by controlling a strain occurring in a direction vertical to the stretching direction.

Advantageous effects of the present disclosure are not limited to the aforementioned effects, and other effects not mentioned herein can be clearly understood by those skilled in the art from the following description.

Although embodiments of the present disclosure have been described with reference to the accompanying drawings, those skilled in the art will appreciate that various modifications and alterations may be made therein without departing from the technical spirit or essential features of the present disclosure. Therefore, it should be understood that the above embodiments are illustrative rather than restrictive in all respects.

The particular implementations shown and described herein are illustrative examples of embodiments and are not intended to otherwise limit the scope of embodiments in any way. For the sake of brevity, conventional electronics, control systems, software, and other functional aspects of the systems may not be described in detail. Furthermore, the connecting lines, or connectors shown in the various presented drawings are intended to represent exemplary functional relationships and/or physical or logical couplings between the various elements. It should be noted that many alternative or additional functional relationships, physical connections or logical connections may be present in a practical device. Moreover, no item or component is essential to the practice of the invention unless the element is specifically described as "essential" or "critical."

It is to be understood that the specific order or hierarchy of the operations included in the presented processes is an example of exemplary approaches. Based upon design priorities, it is to be understood that the specific order or hierarchy of the operations in the processes may be rearranged within the scope of the present disclosure. The appended method claims provide elements of various operations in a sample order and are not meant to be limited to the specific order or hierarchy presented.

Description of the presented embodiments is provided to enable those skilled in the art to use or practice the present disclosure. Various modifications to these embodiments will be apparent to those skilled in the art, and general principles defined herein may be applied to other embodiments without departing from the scope of the present disclosure. Thus, the present disclosure is not to be limited to the embodiments presented herein and is to be interpreted in the broadest sense consistent with the principles and novel features presented herein.

What is claimed is:

1. A method of manufacturing a stretchable substrate, the method comprising:
    generating a first auxetic including a plurality of first unit structures and a first fixing part, and a second auxetic including a plurality of second unit structures and a second fixing part,
    wherein each unit structure of the plurality of first unit structures and the plurality of second unit structures has a porous pattern and includes at least one hole on a sidewall of the unit structure;
    adhering one or more elastic sheets to one surface of each of the first auxetic and the second auxetic; and
    stacking the second auxetic on the first auxetic,
    wherein the plurality of second unit structures of the second auxetic are arranged to be offset from the plurality of first unit structures of the first auxetic, and
    wherein the first fixing part of the first auxetic and the second fixing part of the second auxetic have different formation directions and reduce contraction in a three-dimensional (3D) direction.

2. The method of claim 1, wherein the generating comprises:
   generating the first auxetic on a first fixing surface;
   forming the first fixing part;
   performing curing;
   separating the first fixing surface;
   generating the second auxetic on a second fixing surface;
   forming the second fixing part;
   performing curing; and
   separating the second fixing surface.

3. The method of claim 1, wherein the adhering comprises:
   applying an adhesive or an elastic liquid onto each of the first auxetic and the second auxetic; and
   attaching an elastic sheet to each of the first auxetic and the second auxetic.

4. The method of claim 3, wherein the one or more elastic sheets are attached to both surfaces of each of the first auxetic and the second auxetic.

5. The method of claim 3, wherein the adhering further comprises performing curing.

6. The method of claim 1, wherein the generating comprises:
   forming the first auxetic on a first fixing surface;
   filling a first internal elastomer;
   separating the first fixing surface,
   wherein the first internal elastomer is filled into at least some of the plurality of first unit structures;
   forming the second auxetic on a second fixing surface;
   filling a second internal elastomer; and
   separating the second fixing surface, and
   wherein the second internal elastomer is filled into at least some of the plurality of second unit structures.

7. The method of claim 1, wherein the generating comprises:
   generating a first substrate part made of a first elastic material;
   forming the first auxetic on the first substrate part;
   filling a first internal elastomer into the each unit structure of the plurality of first unit structures;
   generating a second substrate part made of a second elastic material;
   forming the second auxetic on the second substrate part;
   filling a second internal elastomer into the each unit structure of the plurality of second unit structures.

8. The method of claim 6, wherein each of the first internal elastomer and the second internal elastomer is an elastic material with a negative Poisson's ratio.

9. The method of claim 1, wherein the generating comprises:
   generating an additional substrate configured to be included in a flexible electronic device; and
   attaching the first auxetic, to which the one or more elastic sheets is or are adhered, on the additional substrate.

* * * * *